(12) United States Patent
Kim (10) Patent No.: US 11,515,181 B2
(45) Date of Patent: Nov. 29, 2022

(54) DEVICE FOR ATTACHING CONDUCTIVE BALL TO SUBSTRATE WITH PLURALITY OF SEPARATELY CONTROLLED PLATES

(71) Applicant: Samsung Electronics Co., Ltd., Suwon-si (KR)

(72) Inventor: Tae Hwan Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 806 days.

(21) Appl. No.: 16/395,701

(22) Filed: Apr. 26, 2019

(65) Prior Publication Data

US 2020/0105553 A1 Apr. 2, 2020

(30) Foreign Application Priority Data

Sep. 27, 2018 (KR) .................. 10-2018-0115198

(51) Int. Cl.
*H01L 21/67* (2006.01)
*H01L 21/48* (2006.01)

(52) U.S. Cl.
CPC .... *H01L 21/67138* (2013.01); *H01L 21/4853* (2013.01); *H01L 21/67288* (2013.01)

(58) Field of Classification Search
CPC ... H01L 21/4853; H01L 24/742; H01L 24/75; H01L 21/67288; B23K 3/0623
See application file for complete search history.

(56) References Cited

U.S. PATENT DOCUMENTS

| 5,284,287 | A | 2/1994 | Wilson et al. |
| 5,983,490 | A | 11/1999 | Sakemi |
| 6,158,649 | A | 12/2000 | Miura |
| 6,284,568 | B1 * | 9/2001 | Yamamoto .......... H01L 21/4853 257/E21.508 |
| 6,460,755 | B1 * | 10/2002 | Inoue ................... B23K 3/0623 228/41 |
| 6,844,216 | B2 | 1/2005 | Cobbley et al. |
| 2015/0264818 | A1 * | 9/2015 | Hwang ................ H05K 3/3478 29/745 |
| 2016/0181222 | A1 * | 6/2016 | Sood ....................... H01L 24/06 228/41 |

FOREIGN PATENT DOCUMENTS

| JP | 06-029656 A | 2/1994 |
| JP | H1027800 A | 1/1998 |
| JP | 2003-110234 A | 4/2003 |
| JP | 4116911 B2 | 7/2006 |
| JP | 5342755 B2 | 11/2013 |
| JP | 5535395 B2 | 7/2014 |

* cited by examiner

*Primary Examiner* — John P. Dulka
(74) *Attorney, Agent, or Firm* — Muir Patent Law, PLLC (57) ABSTRACT

A device for attaching conductive balls to a substrate includes a first plate, a second plate and a controller. The first plate includes first recesses. Each of the first recesses picks up a corresponding conductive ball to be attached to the semiconductor package. The second plate includes second recesses. Each of the second recesses picks up a corresponding conductive ball to be attached to the semiconductor package. The first plate and the second plate are separated from each other. The controller controls each of the first plate and the second plate to be separately moved up or down so that a lower surface of the first plate and a lower surface of the second plate are positioned differently in a first direction normal the lower surface of the first plate.

20 Claims, 7 Drawing Sheets

DEVICE FOR ATTACHING CONDUCTIVE BALL TO SUBSTRATE WITH PLURALITY OF SEPARATELY CONTROLLED PLATES

CROSS-REFERENCE TO RELATED APPLICATION

This application claims benefit of Korean Patent Application No. 10-2018-0115198 filed on Sep. 27, 2018 in the Korean Intellectual Property Office, the disclosure of which is incorporated herein by reference in its entirety.

BACKGROUND

1. Field

The present inventive concept relates to a device for attaching a conductive ball to a substrate.

2. Description of Related Art

Generally, a semiconductor package may be obtained by encapsulating semiconductor chips on a printed circuit board (PCB) using an encapsulant and cutting the PCB into individual package units. In this case, warpage may occur in the semiconductor package due to a difference in coefficients of thermal expansion between the PCB and the encapsulant and heat applied during processes. Recently, as the PCB and the encapsulant have been reduced in thickness, warpage has increasingly occurred in the semiconductor packages.

In a process of attaching conductive balls, such as solder balls, to the semiconductor package, some of conductive balls are not properly disposed on pads of the semiconductor package with warpage.

SUMMARY

According to an exemplary embodiment of the present inventive concept, a device for attaching a plurality of conductive balls to a substrate includes a first plate, a second plate, a first driver, a second driver and a controller. The first and second plates are separated from each other, each having recesses. Each recess is configured to suction one of the conductive balls. The first and second drivers move up or down the first and second plates, respectively. The controller controls the first and second drivers to cause each of the first and second plates to separately move up or down depending on a distribution of warpage of the substrate so that a lower surface of the first plate and a lower surface of the second plate are positioned differently in a first direction normal to the lower surface of the first plate to reduce a deviation among gaps between a first region of the substrate and the lower surface of the first plate and gaps between a second region of the substrate and the lower surface of the second plate as compared to if the lower surface of the first plate and the lower surface of the second plate had been positioned at the same level with respect to the first direction.

According to an exemplary embodiment of the present inventive concept, a device for attaching conductive balls to a substrate includes plates and a controller. The plates are separated from one another, each having recesses. Each of the recesses picks up and drops a corresponding conductive ball onto the substrate. The controller controls the plates to be separately moved down depending on a distribution of warpage of the substrate so that a deviation among gaps between the substrate and a lower surface of each of the plates is reduced compared to if the lower surface of each of the plates is positioned at the same level in a normal direction of a lower surface of one of the plates.

According to an exemplary embodiment of a device for attaching balls to a substrate includes a first plate, a second plate and a controller. The first plate includes first recesses. Each of the first recesses picks up a first conductive ball to be attached to the substrate. The second plate includes second recesses. Each of the second recesses picks up a second conductive ball to be attached to the substrate. The first plate and the second plate are separated from each other. The controller controls each of the first plate and the second plate to be separately moved up or down so that a lower surface of the first plate and a lower surface of the second plate are positioned differently in a normal direction of the lower surface of the first plate.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
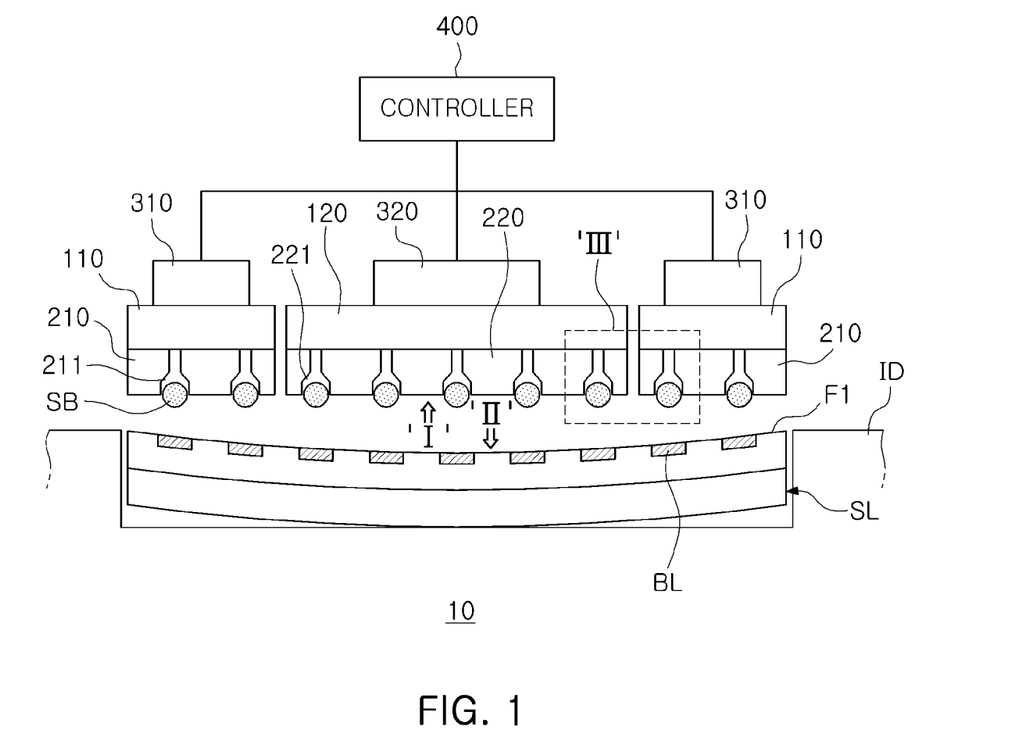
FIG. 1 is a schematic cross-sectional diagram illustrating a device for attaching a conductive ball to a substrate according to an example embodiment in the present inventive concept.
Figure 2A:
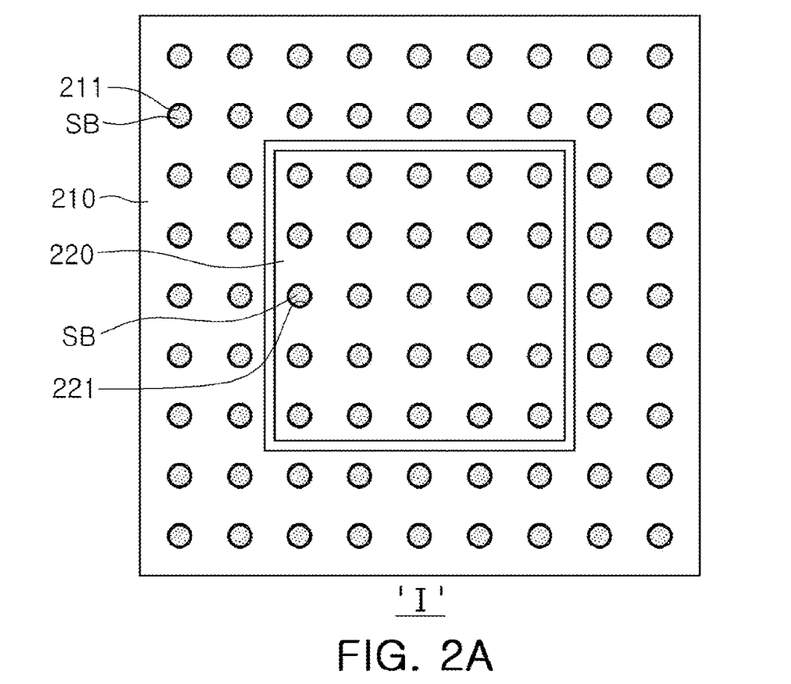
FIG. 2A is a plan diagram illustrating first and second plates taken in direction I in FIG. 1.
Figure 2B:
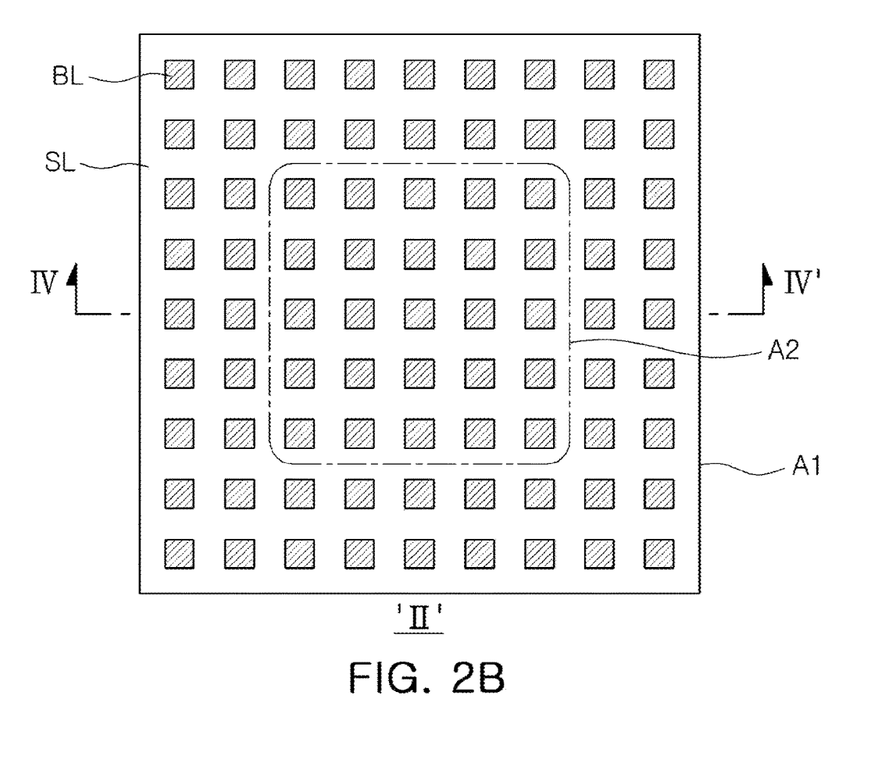
FIG. 2B is a plan diagram illustrating a substrate taken in direction II in FIG. 1.
Figure 3:
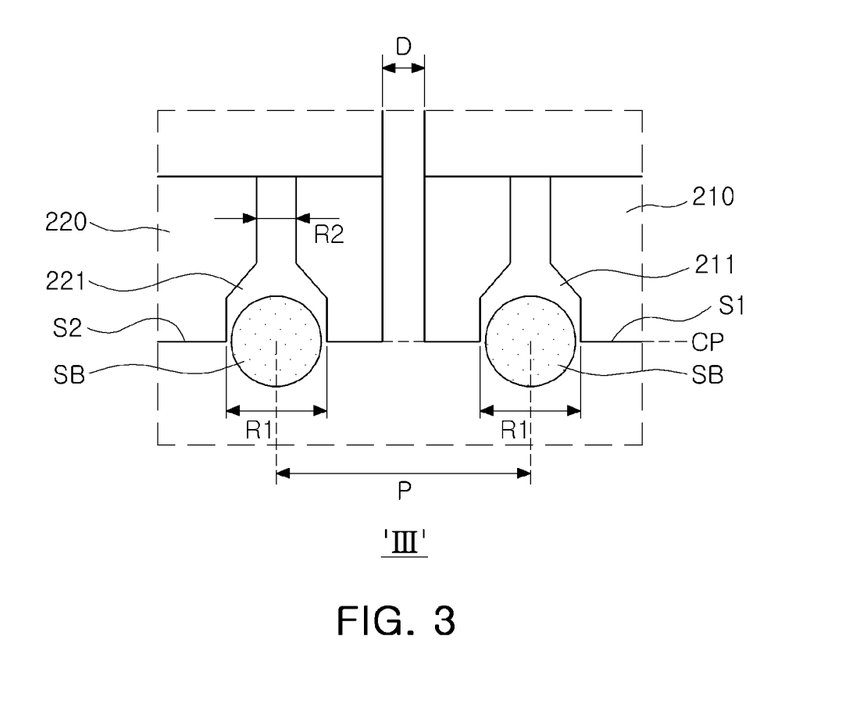
FIG. 3 is a diagram illustrating portion III in FIG. 1 in magnified form.
Figure 4:
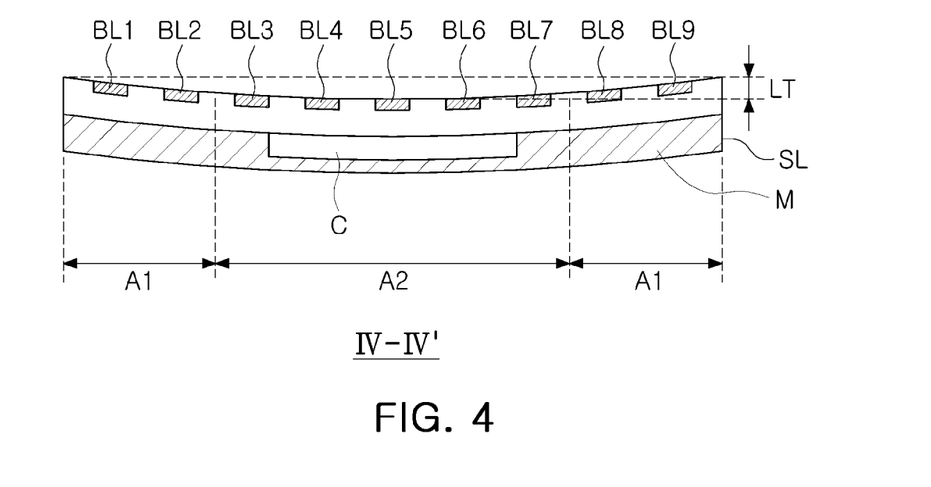
FIG. 4 is a cross-sectional diagram taken along line IV-IV' in FIG. 2B.

A device for attaching a conductive ball to a substrate will be described in detail with reference to FIGS. 1 to 4. FIG. 1 is a schematic cross-sectional diagram illustrating a device for attaching a conductive ball to a substrate according to an example embodiment. FIG. 2A is a plan diagram illustrating first and second plates taken in direction I in FIG. 1. FIG. 2B is a plan diagram illustrating a substrate taken in direction II in FIG. 1. FIG. 3 is a diagram illustrating portion III in FIG. 1 in magnified form. FIG. 4 is a cross-sectional diagram taken along line IV-IV' in FIG. 2B.

Referring to FIG. 1, a device 10 for attaching a conductive ball to a substrate SL according to an example embodiment may include first and second plates 210 and 220 dropping a plurality of conductive balls SB to a substrate SL, and a controller 400 controlling the first and second plates 210 and 220. The device 10 may further include first and second holders 110 and 120 to which the first and second plates 210 and 220 are attached, respectively, and first and second drivers 310 and 320 allowing the first and second plates 210 and 220 attached to the first and second holders 110 and 120 to be separately moved up or down in response to a control signal of the controller 400. For example, the controller 400 may separately control each of the first and second drivers 310 and 320, thereby causing the first and second plates 210 and 220 to be separately moved up or down.

As illustrated in FIGS. 1 and 3, the first and second plates 210 and 220 may be configured to drop the conductive balls SB, such as solder balls, to a plurality of pads BL of the substrate SL, and a plurality of recesses 211 and 221 into each of which a corresponding ball of the conductive balls SB is vacuum-suctioned may be disposed in planar lower surfaces S1 and S2. Each of the plurality of recesses 211 and 221 may be disposed opposite to a corresponding pad of the pads BL of the substrate SL such that each of the conductive balls SB may be dropped from the first and second plates 210 and 220 and placed on a corresponding pad of the pads BL.

Each of the plurality of recesses 211 and 221 may have a first diameter R1 sufficient to receive the conductive balls SB, and portions of the vacuum-suctioned conductive balls SB may be arranged to be externally exposed from the recesses 211 and 221. For example, the recesses 211 and 221 may be connected to a pump so that when the pump is turned on, the recesses 211 and 221 may have a suction force by an air flowing therethrough. Each of the recesses 211 and 221 may have a mouth of the first diameter R1 and an air passage of a second diameter R2 smaller than the first diameter R2, a shoulder connecting the mouth to the air passage. The first and second plates 210 and 220 may pick up the conductive balls SB using the suction force. When the pump is turned off or a pumping speed is reduced, the vacuum-suctioned conductive balls may be released from the first and second recesses 211 and 221.

The plurality of recesses 211 and 221 may be disposed to have equal gaps therebetween (see FIG. 2A). For example, a gap P between the first recesses 211 formed in the first plate 210 and the second recesses 221 formed in the second plate 220 may be configured to be the same as a gap between two adjacent first recesses of the first recesses 211 or a gap between two adjacent second recesses of the second recesses 221. The present disclosure is not limited thereto. For example, the gap P may be different from a gap between two adjacent first recesses of the first recesses 211 or a gap between two adjacent second recesses of the second recesses 221. The gap between two adjacent first recesses of the first recesses 211 may vary at their locations on the lower surface of the first plate 210. The gap between two adjacent second recesses of the second recesses 221 may vary at their locations on the lower surface of the second plate 220.

The first and second plates 210 and 220 may be separately moved up or down by the first and second drivers 310 and 320. The first and second plates 210 and 220 may be spaced apart from each other by a predetermined gap D so that each of the first and second plates 210 and 220 may be separately moved up or down. The first and second drivers 310 and 320 may be driven by a control signal of the controller 400 and may allow the first and second plates 210 and 220 to be separately moved up or down. The first and second plates 210 and 220 may be separately moved up or down depending on a distribution of warpage of the substrate SL by the controller 400 such that a deviation among gaps between the substrate SL and each of the first and second plates 210 and 220 may be reduced. The configuration above will be described in greater detail later.

For example, the controller 400 may control the first and second drivers 310 and 320 to cause each of the first and second plates 210 and 220 to be separately moved up or down depending on the distribution of warpage of the substrate SL so that the lower surface of the first plate 210 and the lower surface of the second plate 220 are positioned differently in a first direction normal to the lower surface of the first plate 210 to reduce a deviation among gaps between a first region A1 (FIG. 4) of the substrate and the lower surface of the first plate 210 and gaps between a second region A2 (FIG. 4) of the substrate and the lower surface of the second plate 220 as compared to if the lower surface of the first plate 210 and the lower surface of the second plate 220 had been located at the same level in the first direction.

Referring to FIGS. 1, 2B, and 4, the substrate SL may be an object to be processed with the device 10. For example, the conductive balls SB may be attached using the device 10 to the substrate SL. The substrates SL may be stacked in an index ID. For example, the index ID may serve as a jig to hold the substrate SL. The substrate SL may have a plurality of the pads BL on a first surface F1, and may be a ball grid array (BGA) package or a fine-pitch ball grid array (FBGA) package in which a semiconductor chip C mounted on a circuit substrate is molded using an encapsulant M. The semiconductor chip C may be electrically connected to the pads BL, and each of the conductive balls SB may be attached to a corresponding pad of the pads BL.

A process of attaching the conductive balls SB to the substrate SL may include processes of applying flux to the pads BL of the substrate SL, picking up the conductive balls SB using a vacuum-suctioning force by the first and second plates 210 and 220, aligning the conductive balls SB to the pads BL, releasing the vacuum-suctioning force of the first and second plates 210 and 220 to drop the conductive balls SB onto the pads BL, and attaching the conductive balls SB to the pads BL.

During the process of molding and manufacturing the semiconductor chip C, warpage of the substrate SL may occur due to a difference or mismatch in coefficients of thermal expansion between the circuit substrate on which the semiconductor chip C is mounted, and the encapsulant M. The warpage of the substrate SL may occur in various forms. For example, the warpage of the substrate SL may be of a concave shape in which a central region of the substrate SL is lower than a peripheral region of the substrate SL, or may be of a convex shape in which a central region of the substrate SL is higher than a peripheral region of the substrate SL. The warpage may also include a concave portion and a convex portion at the same time. For example, the warpage may be of a saddle shape in which the substrate SL may be of both a concave shape in a first direction and a convex shape in a second direction crossing the first direction. The diagrams illustrate the example embodiment in which the substrate SL is of a concave shape or in the shape of a smiling type, but an example embodiment thereof is not limited thereto. For example, the substrate SL with warpage may be of a convex shape or in the shape of a frowning type, or may include both a concave portion and a convex portion at the same time. In the example embodiment, the substrate SL may include a first region A1 and a second region A2 that are to be opposite to the first and second plates 210 and 220, respectively, in the process of attaching the conductive balls SB to the substrate SL. A boundary between the first region A1 and the second region A2 may be defined at a region of which a vertical distance is 50% to 60% of a maximum vertical distance LT between a lowest point and a highest point of the concave substrate SL. The vertical distance may be measured from the highest point. For example, a region of the substrate SL is in the second region A2 when the region is distant at a first vertical distance from the highest point of the concave substrate SL and the first vertical distance is greater than 50% to 60% of the maximum vertical distance LT. If the first vertical distance is smaller than 50% to 60% of the maximum vertical distance LT, the region is in the first region A1 surrounding the second region A2.

When the warpage of the substrate occurs, gaps between the plates from which the conductive ball drops and the pads become uneven due to the warpage as described above to cause various defects in a process of attaching conductive balls to a substrate. For example, the various defects may occur when the dropped conductive ball is not properly landed on the pad. The various defects may include a missing ball defect of the dropped conductive ball not being attached to the pad and missed, an extra ball defect of at least two conductive balls being attached to one pad, a position defect of a conductive ball not being properly disposed on the pad with a partial attachment to the pad, and the like. When such a defect occurs, the unattached conductive ball may need to be attached manually, or the substrate may need to be discarded, and the productivity of the manufacturing process may be lowered. As a result of an experiment, as illustrated in FIG. 4, when first, second, eighth, and ninth pads BL1, BL2, BL8 and BL9 are disposed on a first region A1, and third to seventh pads BL3 to BL7 are disposed on the second region A2, it was highly likely that the defects described above occur in the third to seventh pads BL3 to BL7 disposed on the second region A2 in which a vertical distance of each of the third to seventh pads BL3 to BL7 may be greater than 50%-60% of the maximum vertical distance LT.

The first and second plates 210 and 220 may be arranged based on a value of the warpage of the substrate SL measured in advance. As illustrated in FIGS. 2A and 2B, the first plate 210 may have a shape corresponding to the first region A1 of the substrate SL, and the second plate 220 may have a shape corresponding to the second region A2 of the substrate SL. Generally, the warpage of the substrate occurring in the same process may have the same aspect. For example, substrates that are subject to the same process may have similar warpage. Thus, if the warpage of the substrate SL is measured in advance, and the shapes of the first and second plates 210 and 220 are formed in accordance with the warpage measured in advance, the first and second plates 210 and 220 may be formed with shapes similar to the shape of the substrate SL with the warpage. The diagram illustrates the example embodiment in which the first and second plates 210 and 220 are included, but depending on example embodiments, the distribution of the warpage of the substrate may be further subdivided, and three or more plates may be disposed. For example, the device 10 may comprise first to third plates. The third plate is disposed in a region corresponding to a central region of the substrate, the second plate is disposed in a circumference of the third plate at a first width, and the first plate is disposed in a circumference of the second plate at a second width.

The controller 400 may control the first and second plates 210 and 220 to be separately moved up or down depending on the distribution of the warpage of the substrate SL to reduce a deviation among gaps between the substrate SL and each of the first and second plates 210 and 220. In other words, the controller 400 may reduce gaps between the substrate SL and each of the first and second plates 210 and 220 such that each of the conductive balls SB dropped from the first and second plates 210 and 220 is landed on a corresponding pad of the pads BL of the substrate SL. The distribution of the warpage of the substrate SL may be measured in advance in a process separate from the process of attaching the conductive balls SB to the substrate SL, or may be measured in the process of attaching the conductive ball SB to the substrate SL. The distribution of the warpage of the substrate SL may also be calculated from a value obtained by measuring distances between the substrate SL and a distance measuring unit 1500, such as a laser interferometer, in a plurality of regions of the substrate SL after disposing the distance measuring unit over an upper portion of the substrate SL (see FIG. 5). In other words, the distribution of the warpage of the substrate SL may be calculated based on a deviation of the values obtained by measuring the distances between the distance measuring unit and the substrate SL.

The controller 400 may divide the area of the substrate SL into the first region A1 and the second region A2, based on the values of the vertical distances between the substrate SL and the distance measuring unit 1500. The vertical distances of the substrate SL from the distance measuring unit 1500 may be converted to vertical distances of the substrate SL from the highest point of the substrate SL so that the boundary between the first region A1 and the second region A2 discussed above is located on the substrate SL. The controller 400 may calculate a first distance L1 by which both of the first and second plates 210 and 220 is moved down toward the substrate SL and a second distance L2 by which the second plate 220 is further moved down toward the second region A2 of the substrate SL. For example, the controller 400 may calculate the first distance L1 at which the first plate 210 and the substrate SL are not be in contact with each other but may be adjacent to each other, and may control the first and second plates 210 and 220 to be moved down by the first distance L1 (see FIG. 7). In this case, a portion of each of the conductive balls SB is protruded externally from a corresponding recess of the first and second recesses 211 and 221, and the protruding portion of each of the vacuum-suctioned conductive balls SB is not in contact with the substrate SL at the first distance L1. Also, the controller 400 may, after the first and second plates 210 and 220 are moved down by the first distance L1, calculate the second distance L2 by which the second plate 220 may be further moved down, based on the value obtained by measuring the distances between the substrate SL and the distance measuring unit 1500. The present inventive concept is not limited thereto. For example, the calculation of the second distance L2 may be calculated before the first and second plates 210 and 220 are moved down by the first distance L1. In an exemplary embodiment, the second distance L2 may be calculated when the first distance L1 is calculated. The second distance L2 may be a distance by which the second plate 220 may be further moved down within a range in which the second plate 220 is not in contact with the second region A2 of the substrate SL. The second plate 220 may be further moved down to be within a range in which the conductive balls SB vacuum-suctioned into the second plate 220 do not contact the substrate SL (see FIG. 8). A portion of each of the conductive balls SB may be externally protruded from the second recess 221.

Through the processes described as above, the first plate 210 may be adjacent to the first region A1 of the substrate SL, and the second plate 220 may be adjacent to the second region A2 of the substrate SL. Accordingly, a deviation among gaps between the first region A1 of the substrate SL and the first plate 210 and gaps between the second region A2 of the substrate SL and the second plate 220 may be reduced, and a dropping distance of each of the conductive balls SB dropped from the first and second plates 210 and 220 may be significantly reduced such that the dropping conductive balls SB may be accurately landed on the pads BL to which the conductive balls SB are supposed to be attached. Also, as the dropping distances of the dropping conductive balls SB are significantly reduced, the defect may be prevented that the conductive balls SB collide with the lands BL and bounce back therefrom so that the conductive balls SB are not properly landed on the land pads to which the conductive balls SB are supposed to be attached.

Figure 5:
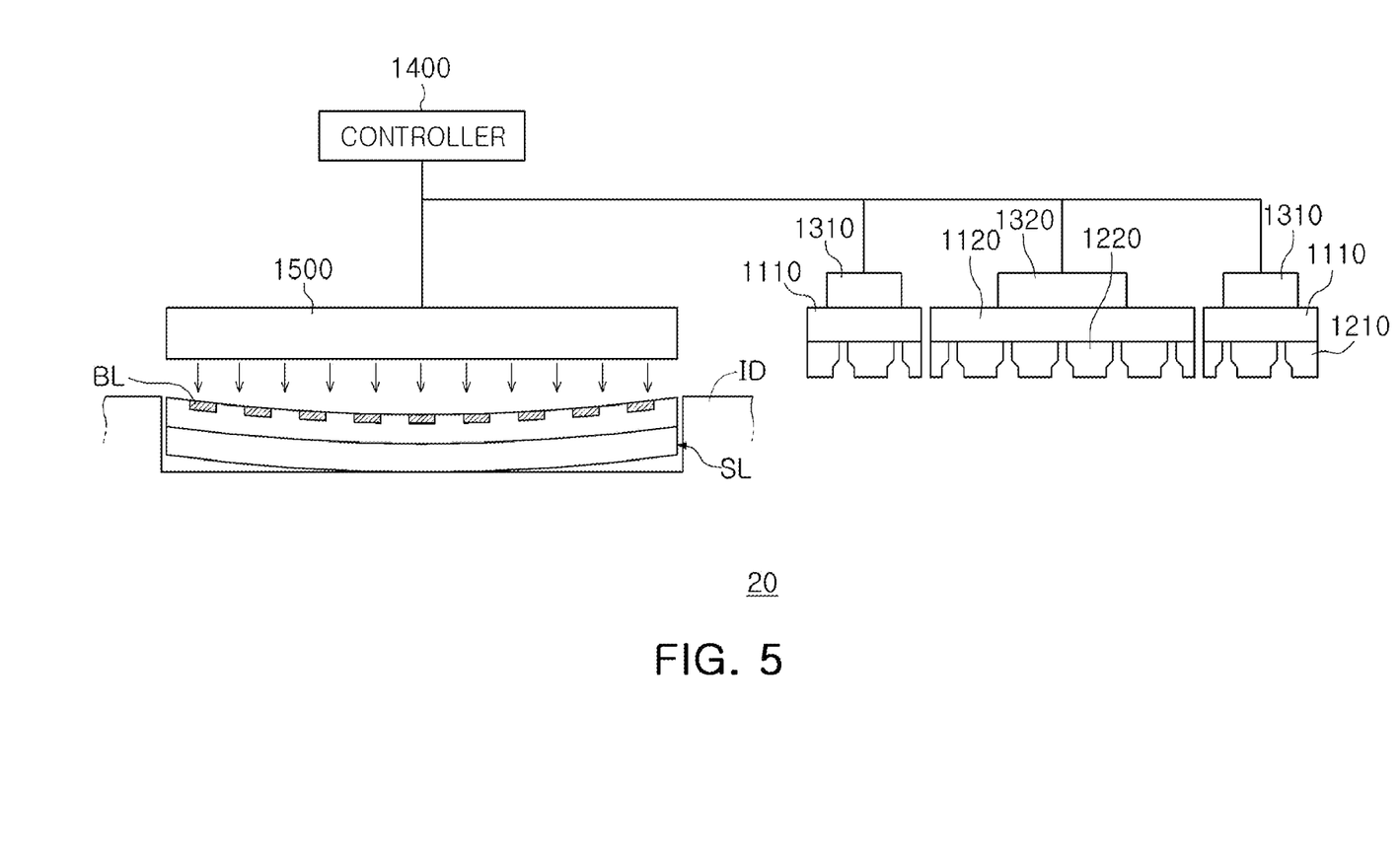
FIG. 5 is a diagram illustrating a device for attaching a conductive ball to a substrate according to an example embodiment in the present inventive concept.

FIG. 5 is a diagram illustrating a device for attaching a conductive ball to a substrate according to an example embodiment. The device 20 of FIG. 5 may further include a distance measuring unit 1500. The device 20 may include first and second plates 1210 and 1220 dropping a plurality of conductive balls SB to a substrate SL, a controller 1400, first and second holders 1110 and 1120 to which the first and second plates 1210 and 1220 are respectively attached, and first and second drivers 1310 and 1320 allowing the first and second plates 1210 and 1220 attached to the first and second holders 1110 and 1120 to be separately moved down or up in response to a control signal of the controller 1400. The configuration of the device 20 may be substantially the same as in the aforementioned example embodiment, and thus, the detailed descriptions thereof will not be repeated.

Figure 6:
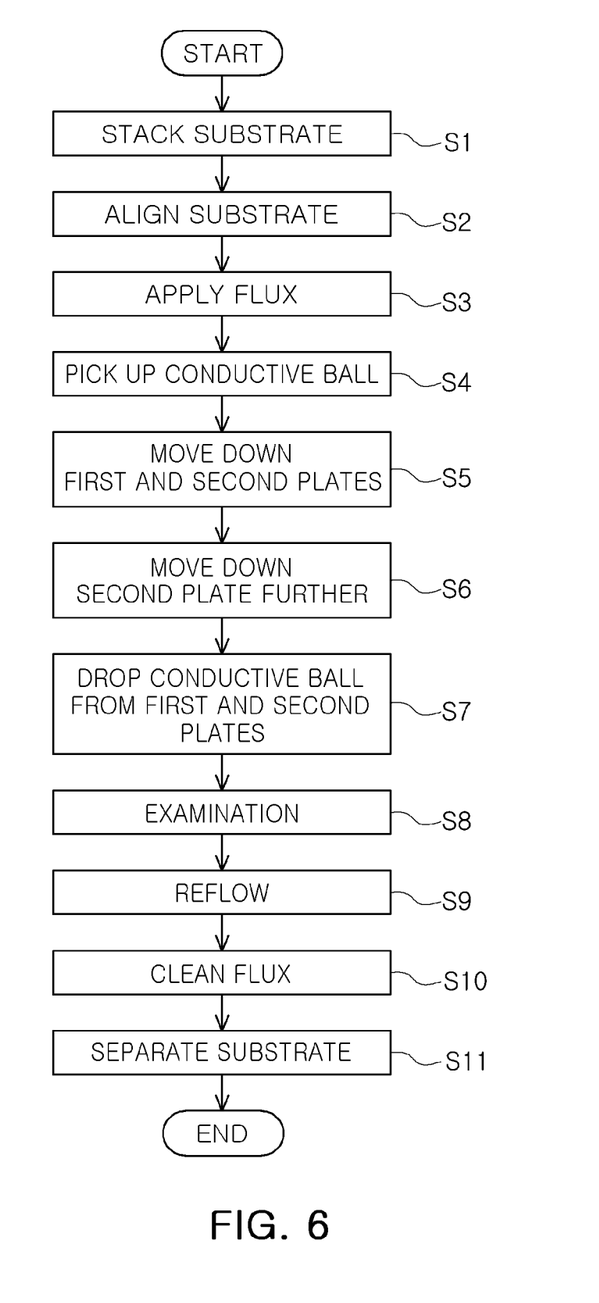
FIG. 6 is a flowchart illustrating a process of attaching a conductive ball using a device for attaching a conductive ball according to an example embodiment in the present inventive concept.
Figure 7:
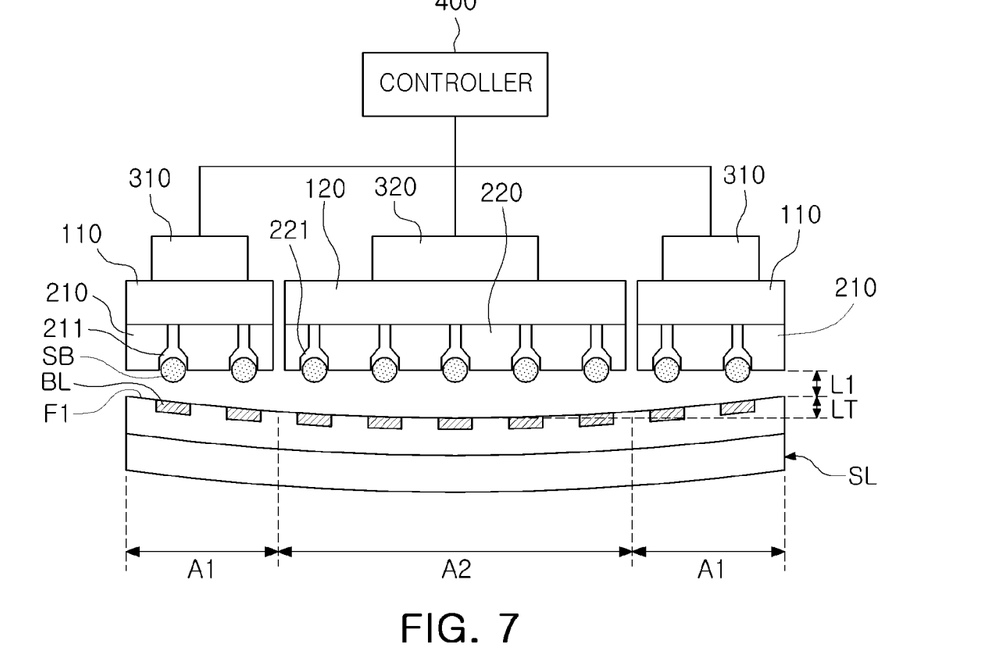
FIGS. 7 to 9 are diagrams illustrating processes S5 to S7 in FIG. 6.
Figure 8:
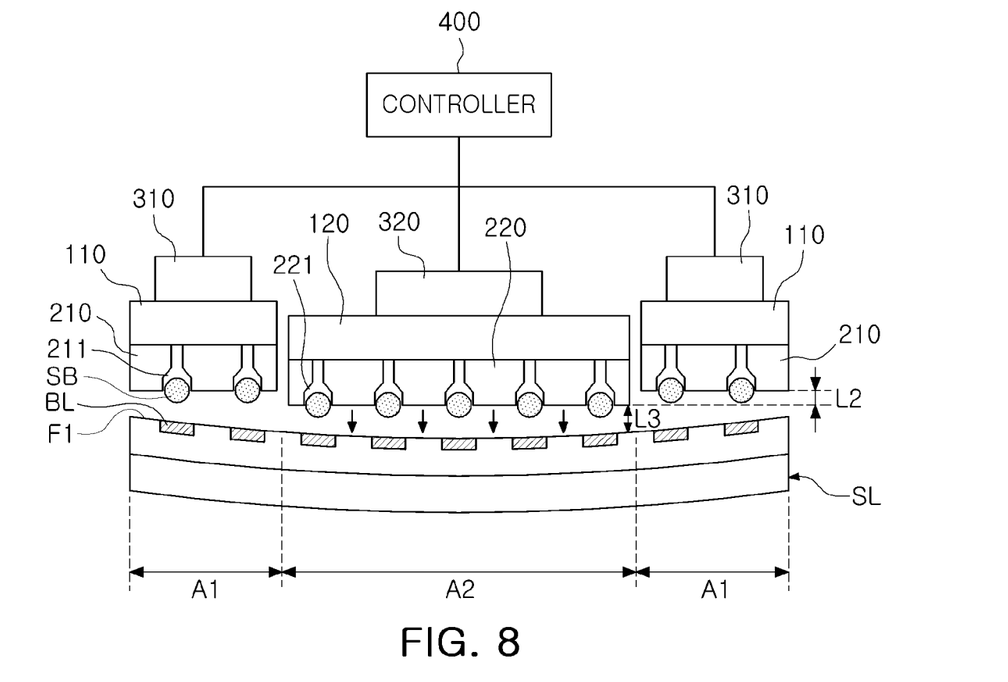
Figure 9:
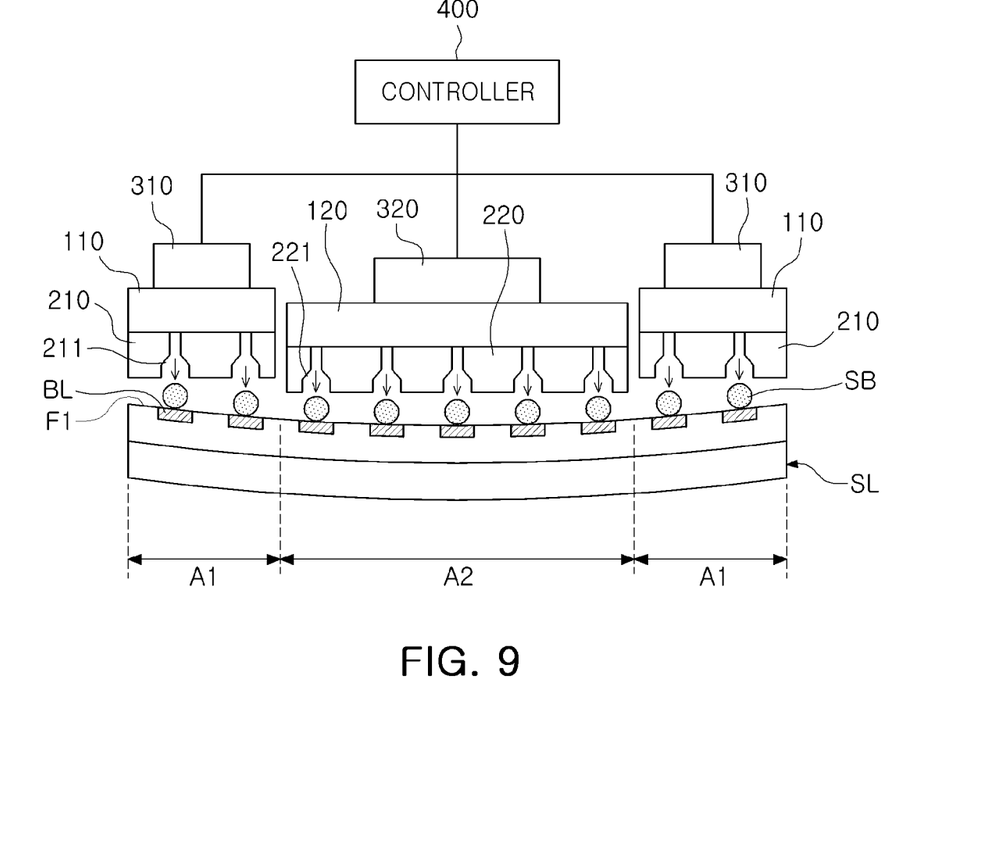

In the description below, a process of manufacturing a semiconductor package using a device for attaching a conductive ball to a substrate according to an example embodiment will be described with reference to FIGS. 6 to 9. FIG. 6 is a flowchart illustrating a process of attaching a conductive ball using a device for attaching a conductive ball according to an example embodiment. FIGS. 7 to 9 are diagrams illustrating steps S5 to S7 in FIG. 6. The descriptions which overlap the descriptions of the device 10 for attaching a conductive ball to a substrate described above will not be repeated, and elements having the same reference numerals may be the same elements. In the description below, a substrate SL with warpage of a concave shape will be described.

The substrates SL may be stacked in an index ID to attach a plurality of conductive balls SB (S1).

The substrates SL may be aligned to a lower portion of the device 10 by moving the index ID (S2). In this process, a distance between a distance measuring unit and the substrate SL may be measured in a plurality of regions of the substrate SL using the distance measuring unit such as a laser interferometer, and a controller 400 may calculate a distribution of warpage of the substrate SL based on the measured distance value. Depending on example embodiments, the distribution of the warpage of the substrate SL may be measured in an additional process in advance and stored in a memory, and the controller 400 may calculate the distribution of the warpage of the substrate SL based on the measured value stored in the memory.

Flux may be applied on a plurality of pads BL of the substrate SL (S3), and the conductive balls SB may be picked up by being vacuum-suctioned into first and second recesses 211 and 221 of the device 10 (S4). The conductive balls SB may be protruded from and be fixed to the first and second recesses 211 and 221 using a vacuum-suction force. In this case, a portion of each of the conductive balls SB may be externally protruded from a corresponding recess of the first and second recesses 211 and 221.

Thereafter, as illustrated in FIG. 7, the controller 400 may control the first and second plates 210 and 220 to be simultaneously moved down based on the distribution of the warpage of the substrate SL, and may dispose the first and second plates 210 and 220 over an upper portion of the substrate SL. The controller 400 may calculate a first distance L1 based on the calculated distribution of the warpage of the substrate SL and may control the first and second plates 210 and 220 to be moved down by the first distance L1 so that the first plate 210 and the substrate SL are not in contact with each other but adjacent to each other. When a portion of each of the conductive balls SB is externally protruded from a corresponding recess of the first and second recesses 211 and 221, the conductive balls SB picked up by the first plate 210 is not in contact with the substrate SL at the first distance L1 (S5). The first distance L1 may be calculated with reference to the most protruded portion of a first region A1 of the substrate SL. Accordingly, the first plate 210 may become adjacent to the substrate SL, but due to the warpage of the substrate SL, the second plate 220 may be further spaced apart from the first plate 210. In this state, when the conductive balls SB are dropped, the conductive balls SB dropped in the first region A1 of the substrate SL may be properly landed on the pad BL, but due to the increased dropping distance, the conductive balls SB dropped in the second region A2 are not properly landed on the pads to which the conductive balls SB are supposed to be attached, or the conductive balls SB may collide with the pads BL and bounce back so that the conductive balls SB are not properly landed on the pads to which the conductive balls SB are supposed to be attached. In the example embodiment, by performing a subsequent process to reduce gaps between the substrate SL and the second plate 220, the conductive balls SB dropped in the second region A2 may be properly landed on the pads BL to which the conductive balls SB are supposed to be attached.

Referring to FIG. 8, the controller 400 may calculate the second distance L2 by which the second plate 220 may be further moved down to be within a range in which the second plate 220 is not in contact with the second region A2 of the substrate SL based on the calculated distribution of the warpage and may control the second plate 220 to be further moved down by the second distance L2 (S6). The process of calculating the second distance L2 by the controller 400 may be performed in the process of calculating the first distance L1 described above. As described above, a portion of each of the conductive balls SB is externally protruded from the second recess 221, and the second plate 220 may be moved down to be within a range in which the substrate SL and the conductive balls SB maintain a predetermined distance L3 in which the second plate 220 is not in contact with the substrate SL. The second distance L2 may be calculated with reference to the most protruded portion of the second region A2 of the substrate SL.

Referring to FIG. 9, the first and second plates 210 and 220 may drop the conductive balls SB, and the conductive balls SB may respectively be landed on the pads BL of the substrate SL (S7).

Whether the conductive balls SB are properly landed on the pads BL may be examined (S8). When the conductive balls SB are determined as properly landed on the pads BL, the conductive balls SB may be reflowed and attached to the pads BL (S9).

The flux applied on the substrate SL may be cleaned (S10), and the substrate SL may be separated from the index ID (S11).

According to the aforementioned example embodiments, the device for attaching a conductive ball to a substrate with warpage occurred in the process of manufacturing a semiconductor package may properly mount the conductive balls on the pads of the semiconductor package.

While the example embodiments have been shown and described above, it will be apparent to those skilled in the art that modifications and variations could be made without departing from the scope of the present inventive concept as defined by the appended claims.

What is claimed is:

1. A device for attaching a plurality of conductive balls to a substrate, comprising:
a first plate and a second plate separated from each other, each having a plurality of recesses, wherein each of the plurality of recesses is configured to suction one conductive ball of the plurality of conductive balls;
a first driver and a second driver configured to move up or down the first and second plates, respectively; and
a controller controlling the first and second drivers to cause each of the first and second plates to separately move up or down depending on a distribution of warpage of the substrate so that a lower surface of the first plate and a lower surface of the second plate are positioned differently in a first direction normal to the lower surface of the first plate to reduce a deviation among gaps between a first region of the substrate and the lower surface of the first plate and gaps between a second region of the substrate and the lower surface of the second plate as compared to if the lower surface of the first plate and the lower surface of the second plate had been positioned at the same level with respect to the first direction.

2. The device of claim 1, further comprising:
a distance measuring unit, in response to a control signal of the controller, measuring a plurality of first vertical distances between the first region of the substrate and the lower surface of the first plate and a plurality of second vertical distances between the second region of the substrate and the lower surface of the second plate,
wherein the controller calculates the distribution of the warpage of the substrate using the plurality of first vertical distances and the plurality of second vertical distances measured by the distance measuring unit.

3. The device of claim 2,
wherein the distance measuring unit is a laser interferometer.

4. The device of claim 1,
wherein the controller calculates a first calculated distance and a second calculated distance based on the distribution of the warpage of the substrate and causes the lower surface of the first plate and the lower surface of the second plate to be separately moved up or down using the first and second calculated distances.

5. The device of claim 4,
wherein the second plate is aligned to the second region of the substrate.

6. The device of claim 4,
wherein, based on the distribution of the warpage of the substrate, the first and second plates are moved down by the first calculated distance toward the substrate, and one of the first and second plates is further moved down by the second calculated distance.

7. The device of claim 6,
wherein the first and second plates are configured to drop the plurality of conductive balls suctioned by the first and second plates after one of the first and second plates is further moved down by the second calculated distance toward the substrate.

8. The device of claim 4,
wherein the distribution of the warpage of the substrate is of a concave shape, and
wherein the controller controls the first and second drivers to move down the first and second plates toward the substrate by the first calculated distance and further controls the second driver to move down the second plate toward the substrate by the second calculated distance.

9. The device of claim 1,
wherein the first plate surrounds a circumference of the second plate, and
wherein the first plate and the second plate are separated from each other with a first gap therebetween.

10. The device of claim 9,
wherein the first gap between the first plate and the second plate is the same in size as a second gap between two adjacent recesses of the plurality of recesses.

11. The device of claim 1,
wherein the lower surface of the first plate and the lower surface of the second plate are opposite to the substrate, and the lower surface of the first plate and the lower surface of the second plate are planar surfaces.

12. The device of claim 11,
wherein the controller separately controls each of the first and second drivers so that each of the first and second plates is separately moved up or down to be located differently in the first direction.

13. A device for attaching a plurality of conductive balls to a substrate, comprising:
a plurality of plates separated from one another, each having a plurality of recesses, wherein each of the plurality of recesses is configured to pick up and drop a corresponding conductive ball of the plurality of conductive balls onto the substrate; and
a controller controlling the plurality of plates to be separately moved down depending on a distribution of warpage of the substrate so that a deviation among gaps between the substrate and a lower surface of each of the plurality of plates is reduced as compared to if the lower surface of each of the plurality of plates had been positioned at the same level in a first direction normal to a lower surface of one plate of the plurality of plates.

14. The device of claim 13,
wherein the plurality of plates comprise first to third plates, the third plate is disposed in a region corresponding to a central region of the substrate, the second plate having a first width is disposed in a circumference of the third plate, and the first plate having a second width is disposed in a circumference of the second plate.

15. The device of claim 13, further comprising:
a plurality of holders fixed to the plurality of plates; and
a plurality of drivers allowing the plurality of holders to be moved down or up respectively.

16. The device of claim 13,
wherein the plurality of plates have lower surfaces facing the substrate, and
wherein the lower surfaces are planar surfaces.

17. The device of claim 13,
wherein the distribution of the warpage of the substrate is stored in advance.

18. A device for attaching a plurality of conductive balls to a substrate, comprising:
a first plate having a plurality of first recesses, wherein each first recess of the plurality of first recesses is configured to pick up a corresponding conductive ball of the plurality of conductive balls to be attached to the substrate;

a second plate having a plurality of second recesses, wherein each second recess of the plurality of second recesses is configured to pick up a corresponding conductive ball of the plurality of conductive balls to be attached to the substrate, and wherein the first plate and the second plate are separated from each other;

a controller controlling each of the first plate and the second plate to be separately moved up or down so that a lower surface of the first plate and a lower surface of the second plate are positioned differently in a first direction normal to the lower surface of the first plate; and a distance measuring unit, in response to a control signal from the controller, measuring a plurality of first vertical distances between a substrate and the lower surface of the first plate and a plurality of second vertical distances between the substrate and the lower surface of the second plate.

19. The device of claim 18, further comprising:
wherein the controller calculates a distribution of warpage of the substrate based on the plurality of first vertical distances and the plurality of second vertical distances.

20. The device of claim 18, further comprising:
a first driver, in response to a control signal from the controller, moving up or down the first plate in the first direction; and
a second driver, in response to the control signal from the controller, moving up or down the second plate in the first direction,
wherein the control signal separately controls the first driver and the second driver.

* * * * *